United States Patent [19]
Duhamel et al.

[11] Patent Number: 4,974,186
[45] Date of Patent: Nov. 27, 1990

[54] GENERALIZED DIGITAL MULTIPLIER AND DIGITAL FILTER USING SAID MULTIPLIER

[75] Inventors: Pierre Duhamel, Issy Les Moulineaux; Zhijian Mou, Paris; Michel Cand, Saint Ismier, all of France

[73] Assignee: Etat Francais Represente par le Ministere des Postes, des Telecommunication et de L'Espace (CNET), Issy Les Moulineaux, France

[21] Appl. No.: 300,884

[22] Filed: Jan. 24, 1989

[30] Foreign Application Priority Data
Feb. 2, 1988 [FR] France ................................ 8801193

[51] Int. Cl.$^5$ ............................................. G06F 7/50
[52] U.S. Cl. ............................ 364/750.5; 364/724.16
[58] Field of Search ........... 364/750.5, 724.16, 728.01, 364/728.03

[56] References Cited
U.S. PATENT DOCUMENTS

| 4,490,805 | 12/1984 | Tamura | 364/750.5 |
| 4,573,136 | 2/1986 | Rossiter | 364/750.5 |
| 4,616,330 | 10/1986 | Betz | 364/728.03 |

Primary Examiner—David H. Malzahn
Attorney, Agent, or Firm—Nixon & Vanderhye

[57] ABSTRACT

The multiplier according to the invention comprises N shift registers ($RD_O, \ldots, RD_{N-1}$) containing the words $x_i$ on B bits, N conditional adders ($AdC_O, \ldots, AdC_{N-1}$) each adding to the partial sum which they receive a constant coefficient ($a_1$), conditional on the value of the bit ($x_{i,j}$) which they receive from the associated register ($RD_1$) and an adder accumulator (AdAc). The digital filter using such a multiplier also comprises a parallel word input register.

6 Claims, 6 Drawing Sheets

GENERALIZED DIGITAL MULTIPLIER AND DIGITAL FILTER USING SAID MULTIPLIER

BACKGROUND OF THE INVENTION

1. Field of the Invention

The present invention relates to a generalized digital multiplier and a digital filter using said multiplier.

Discussion of Related Art

Digital multipliers are used in digital signal processing, in the calculation of quantities called "scalar products" (or sometimes "internal products") in the form:

$$P = \sum_{i=0}^{N-1} a_i x_i \qquad (1)$$

In this expression, i designates a rank or order, the terms $x_i$ a group of N variable signals and terms $a_i$ a group of N given coefficients which are constant. Such products are in particular found in digital filtering.

Figures 1, 2:
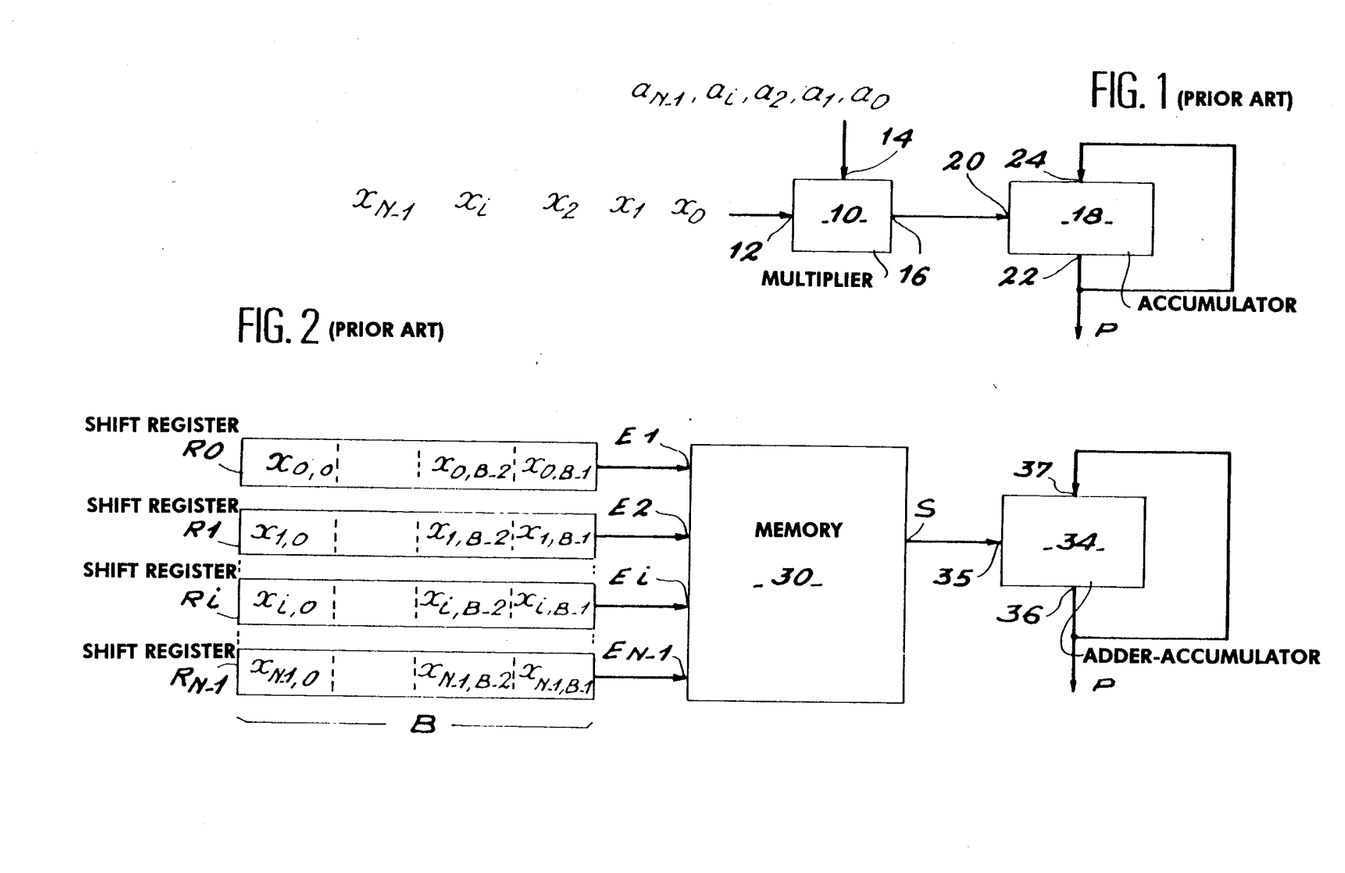
FIG. 1 is a block diagram of a prior art circuit for calculating P.
FIG. 2 is a block diagram of prior art multiplier.

In order to calculate the quantity defined by (1), use is sometimes made of a circuit as shown in FIG. 1. A multiplier 10 receives on a first input 12 successively $x_i$ and on a second input 14 successively $a_i$. At its output 16, the multiplier successively supplies the products $a_i x_i$. An accumulator 18 has first and second inputs 20, 24 and an output 22 looped onto the second input 24. After N clock strokes (if i assumes all the integral values between 0 and N−1), the accumulator supplies the sought product P.

Another way of carrying out this operation consists of using a procedure called "distributed arithmetic". It firstly consists of breaking down the terms $x_i$ into their B bits:

$$x_i = \sum_{j=0}^{B-1} x_{ij} 2^j \qquad (2)$$

in which j ranges between 0 (lowest order bit) and B−1 (highest order bit). This, shown in equation 1, involves a double summation:

$$P = \sum_{i=0}^{N-1} \left( a_i \sum_{j=0}^{B-1} x_{ij} 2^j \right)$$

In this operation, it is possible to reverse the order of the summations and write:

$$P = \sum_{j=0}^{B-1} \left( \sum_{i=0}^{N-1} a_i x_{ij} \right) 2^j \qquad (3)$$

As the bits $x_{ij}$ can assume the value 0 or 1, each product $a_i x_{ij} 2^j$, for j given, is equal either to 0 or to $a_i 2^j$. The sum $f_j$ of N such products is the sum of N terms, whereof each can assume two values. Therefore this sum can assume $2^N$ different values. All these $2^N$ values are determined and can be calculated beforehand because the $a_i$ are themselves determined and known.

Thus, the bracketed term in equation (3) is equal to one of the terms of this group of values and which is defined by the N bits $x_{ij}$, in which the order j is fixed and the order i varies from 0 to N−1.

A multiplier for performing this procedure is in the form shown in FIG. 2. Shift registers $R_0, R_1, R_i, R_{N-1}$ with B cells, each contain the B bits of each word $x_i$. A read only memory or ROM 30 of two words of m bits has N Inputs $E_1, E_2 \ldots, E_i \ldots, E_{N-1}$ connected to the respective outputs of the N registers $R_i$. In said memory are placed the $2^N$ possible values referred to hereinbefore for the partial products. Memory 30 has an output S connected to an adder-accumulator 34 with a first input 35, an output 36 and a second input 37. Output 36 is relooped onto the second input 37. A not shown clock times the shifting in the registers, the reading of the memory and the adder-subtractor.

When after a clock stroke a group of N bits $x_{ij}$ (j determined, i between 0 and N−1) is applied to the memory inputs $E_1 \ldots, E_{N-1}$, the memory is addressed by this group and supplies the corresponding product $f_j$. It is then necessary to form the sum of these partial products, which is carried out by adder 34.

For simplification purposes, it is assumed hereinbefore that all the products to be added were positive, i.e. that only additions had to be carried out. However, in practice the considered numbers have a sign. Therefore the supplementary question arises as to the sign of the various manipulated quantities. However, the Expert knows how to solve this question (use of the two's complement binary code) and it is consequently unnecessary to go into detail about this here.

Another method for obtaining a scalar product is the use of a so-called "parallel multiplier" circuit. On having to multiply a term a by a term x to obtain the partial product Pr, as stated hereinbefore for (3), it is possible to break down x into its bits:

$$x = \sum_{j=0}^{B-1} (X_j) 2^j \qquad (3')$$

The product ax is consequently in the form:

$$Pr = \sum_{j=0}^{B-1} (X_j) a 2^j \qquad (4)$$

The term $X_j$ is a bit equal to 0 or 1. The term $a 2^j$ is a word shifted by j positions.

Thus, in material terms, the expression (4) represents the addition to the partial result obtained before order j of a word a shifted by j positions, conditionally with respect to the value of bit $A_j$ of order j of the binary representation of term a:

$$a = \sum_{j=0}^{B-1} A_j 2^j$$

Figure 3:
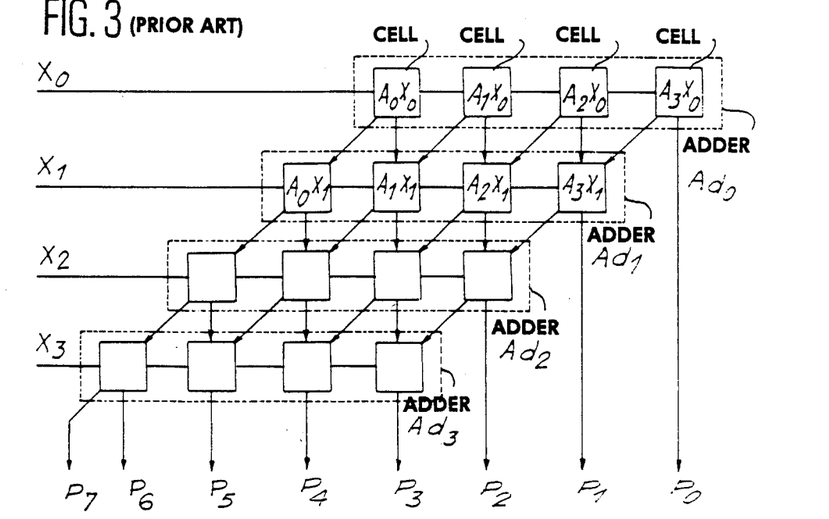
FIG. 3 is a block diagram of further prior art parallel multiplier.

The general diagram of a parallel multiplier for 4 bit words (which corresponds in the present notation to N=4) is shown in FIG. 3. It comprises four adders $Ad_0$, $Ad_1$, $Ad_2$ and $Ad_3$, each constituted by four cells, whose structure is given in FIG. 4. A cell C comprises a first input 40 receiving a first bit, a second input 42 receiving a second bit, a hold input 44, a hold output 46, a propagation input 48 and a propagation output 50.

The four cells of the first adder $Ad_0$ respectively form the products $A_0 X_0, A_1 X_0, A_2 X_0$ and $A_3 X_0$.

Adder $Ad_1$ is shifted by one position to the left compared with adder $Ad_0$. Its four cells perform the operation consisting of adding to the results supplied by the four cells of adder $Ad_0$, the word a $(A_3 A_2 A_1 A_0)$ shifted by one position to the left.

Finally, the multiplier has eight outputs $P_0$ to $P_7$ on which is found the result of the product of a by x.

Figures 4, 5, 6:
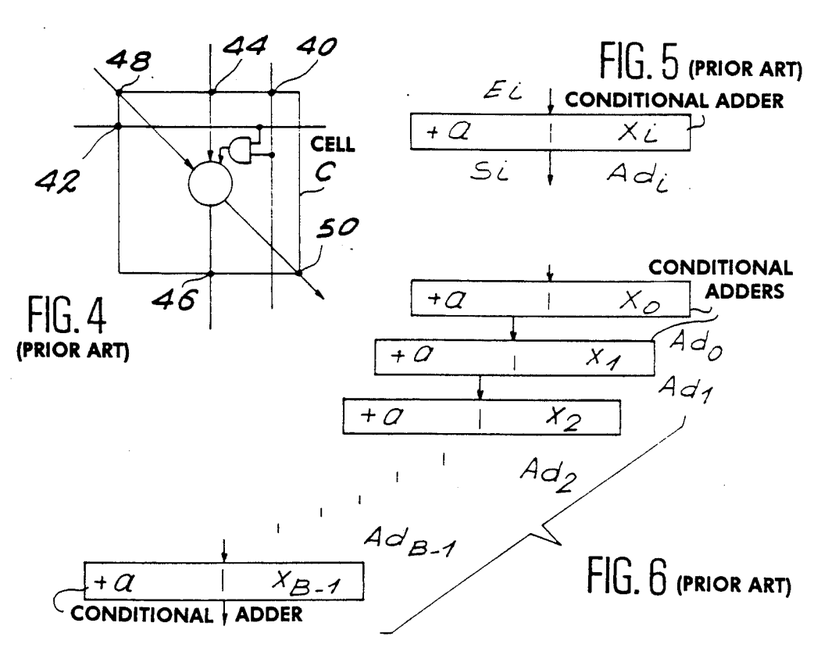
FIG. 4 is a block diagram of a prior art adder cell.
FIG. 5 is a block diagram of a prior art conditional adder.
FIG. 6 is a block diagram of a further prior art parallel multiplier.

Each adder of the multiplier of FIG. 3 can be diagrammatically represented in the manner shown in FIG. 5. A conditional adder $Ad_i$ comprises an input $E_i$ receiving a word to which is added the word a conditionally to the value of bit $X_i$ and supplies the result on output $S_i$.

The block diagram of a parallel multiplier is consequently that of FIG. 6 with B conditional adders $Ad_0$, $Ad_1 \ldots Ad_{B-1}$.

In practice, as a is known, it is a question of carrying out an addition, whereof one of the operands (a) is known. This constant is broken down into bits ($A_0, A_1 \ldots A_{B-1}$) equal to 0 or 1, as a function of a known distribution. Thus, in advance, it is possible to produce specialized adders for each constant. For this purpose, it is merely necessary to adapt a conventional cell, like that of FIG. 4, in order to specialize it for the addition of a bit equal to 0 or 1. Therefore the complexity of the circuit is reduced by a factor almost equal to 2.

French patent application No. 86.13222 filed on Sept. 22 1986 describes two specialized addition cells of this type. This is illustrated by the attached FIGS. 7a and 7b. The addition cell of FIG. 7a comprises a data input $x_i$ receiving a bit, an inverter 50, a hold input $C_i$, a switch 52 constituted by a P channel CMOS transistor 53 and a N channel CMOS transistor 55, an exclusive OR gate 56 having an output $S_i$, a N channel CMOS transistor 58 receiving a fixed potential $V_{SS}$ corresponding to logic state 1 and supplying a hold output signal $C_{i+1}$. Transistors 53 and 55 respectively receive on their gates the bits $\overline{X}_i$ and $X_i$. Transistor 58 is controlled by the complement $\overline{A}_i$ of bit $A_i$.

Figures 7A, 7B:
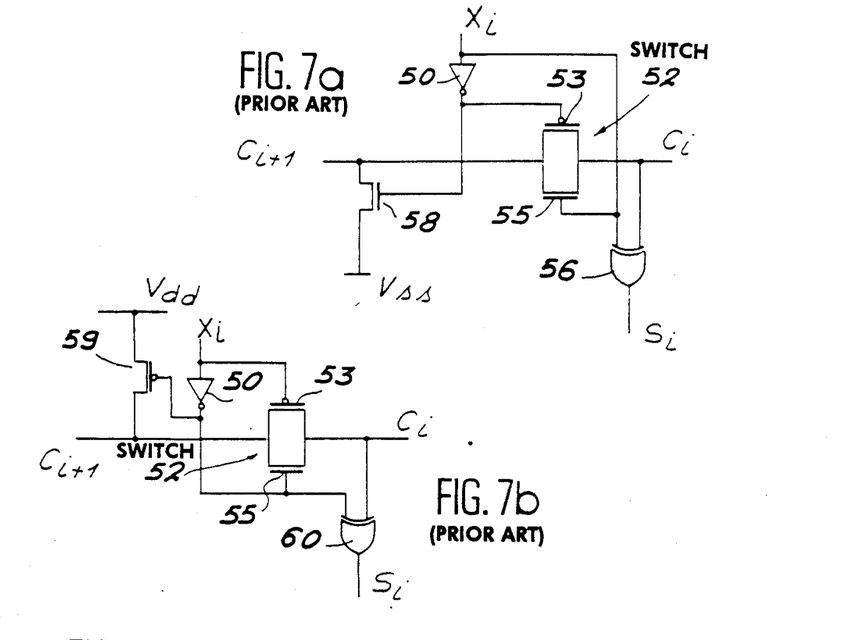
FIGS. 7a and 7b are block diagrams of prior art specialized addition cells.

The cell of FIG. 7b comprises the same elements, except that transistors 53 and 55 no longer receive $\overline{X}_i$ and $X_i$ and instead receive $X_i$ and $\overline{X}_i$ and that the P channel CMOS transistor 59 receives a fixed potential $V_{dd}$ corresponding to logic state 0.

Figure 8A:
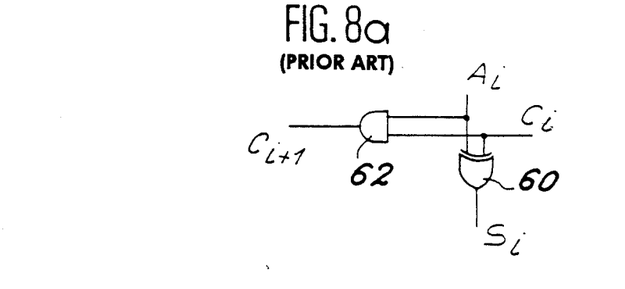
FIGS. 8a and 8b are block diagrams of prior art logic gate cells.
Figure 8B:
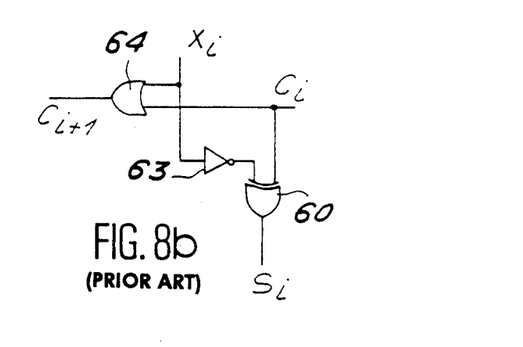

The addition cells of FIGS. 7a and 7b are shown in the form of logic gates in FIGS. 8a and 8b. The addition cell of FIG. 8a is thus reduced to two logic gates, namely an exclusive OR gate 60 and an AND gate 62. Each gate receives on one input the bit $X_i$ and on the other input the hold bit $C_i$. The AND gate 62 supplies the hold bit $C_{i+1}$ and the exclusive OR gate 60 the sum bit $S_i$.

The addition cell shown in FIG. 8b comprises an inverter 63, an exclusive OR gate 60 and an OR gate 64. Inverter 63 receives bit $X_i$. Its output is connected to one of the inputs of the exclusive OR gate 60, whilst the other input receives the hold bit $C_i$. The output of the exclusive OR gate 60 supplies the sum $S_i$. Finally, OR gate 54 receives on its inputs bits $X_i$ and $C_i$ and supplies the hold bit $C_{i+1}$.

Thus, a complete adder comprises addition cells like those shown in FIGS. 7a and 7b or 8a and 8b. These addition cells are connected in series, i.e. the hold output of one addition cell is connected to the hold input of the following addition cell.

Figure 9:
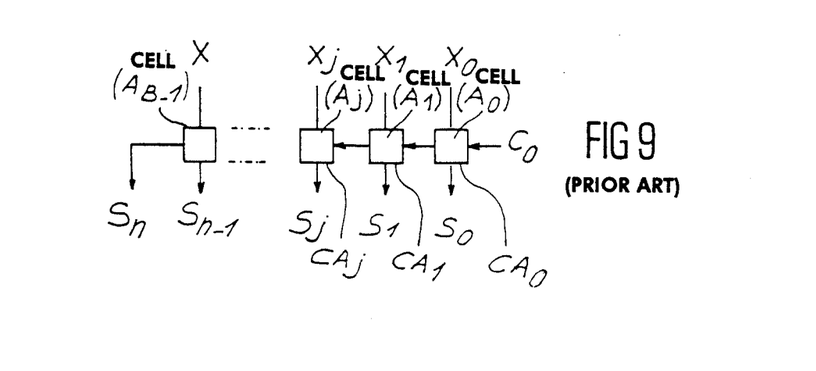
FIG. 9 is a block diagram of a prior art adder.

FIG. 9 diagrammatically shows an adder of this type. It comprises a group of addition cells $CA_0$, $CA_1$, $CA_j$, $CA_{B-1}$, which are connected in series. Each addition cell receives a bit $X_j$ and has a specific structure, which is a function of the logic value of the bit $A_j$ of the fixed and known operand $A_{B-1}, \ldots A_1, A_0$.

Figure 10:
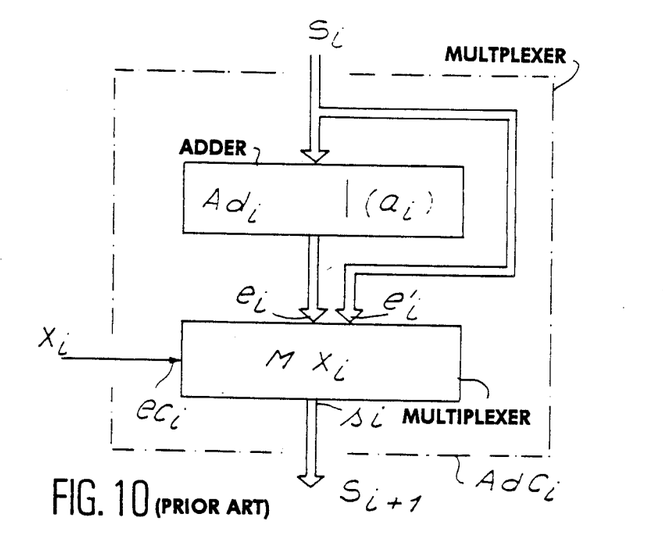
FIG. 10 is a block diagram of a prior art multiplexer.

In order to obtain an operational adder from said adder, it is necessary to add a multiplexer as shown in FIG. 10. In the latter, the conditional adder of order i, i.e. $AdC_i$ is constituted by an adder $Ad_i$ according to FIG. 9 and receives a partial sum $S_i$ from a multiplexer $MX_i$ having two inputs, one input $e_i$ being connected to the output of adder $Ad_i$ and the other $e'_i$ to the input of said same adder. This multiplexer has a control input $ec_i$, which receives the bit $X_i$, which is a conditional bit, as well as an output $s_i$, which supplies a new sum $S_{i+1}$. If the conditional bit $X_i$ is at 0, the multiplexer directly supplies $S_i$ "short-circuiting" adder $Ad_i$, so that we obtain $S_{i+1} = S_i$. If the conditional bit $X_i$ is at 1, the addition carried out in $Ad_i$ is taken into account and a new sum $S_{i+1}$ differing from $S_i$ is obtained ($S_{i+1} = S_i + a_i$).

Such an adder can be used no matter what the sign of the two operands. In the case where the fixed operand is negative, it is merely necessary to choose the addition cells in such a way that this operand is represented in two's complement code.

The adder can also be used as a subtractor, it being sufficient in this case to interchange the addition cells of the first and second type which, as in the preceding case, amounts to adding the complement of the fixed operand and to wire the hold bit $C_0$ to the logic value 1, which amounts to adding the fixed operand $-B$ to the variable operand A.

A parallel multiplier, like that shown in FIG. 6, constituted by adders like that of FIG. 10 treating a fixed operand, therefore makes it possible to obtain a product of type ax. In order to obtain a quantity of form:

$$P = \sum_{i=0}^{N-1} a_i x_i$$

it is necessary to have a plurality of N multipliers of this type, each dedicated to one of the fixed operands $a_0 \ldots a_{N-1}$ and each receiving the N terms $X_0 \ldots X_{N-1}$. A final adder will give the scalar product P.

Although satisfactory in certain respects, these devices, no matter whether they are based on distributed arithmetic or parallel multipliers with a fixed operand, are complex and difficult to realize. Thus, although distributed arithmetic is well adapted when the length of the scalar products is limited (typically below 10) it becomes problematical beyond this, because the size of the memory increases exponentially with the length. For great lengths it is necessary to subdivide the memory into several submemories, whose partial results must then be summated. With regards the integrated circuit performing the operation, this will lead to a loss of a considerable part of the regularity of the etching design. As regards the solution with parallel multipliers, the control of the arrival of the different coefficients is difficult and the connections between the elements have prohibitive lengths on the integrated circuit.

SUMMARY OF THE INVENTION

The present invention relates to a multiplier obviating these disadvantages.

It therefore recommends an adder, whose structure makes it possible to simplify the checking part. There is no longer any need to control the arrival of the coefficients (by buses, memories, sequencers, etc.) and prevent local connections, or at least reduce their length. The design of the corresponding integrated circuit is very repetitive, based on a very limited number of cells. The size of this design increases with N, but only in a linear manner therewith. Moreover, the flow rate of such a device can be adapted by introducing the necessary number of "pipeline" stages. The invention achieves this result through the use of a series bit, parallel word input device and an original multiplier circuit carrying out a parallel processing, the bit-series processing being carried out in an output accumulator.

More specifically, the present invention relates to a generalized numerical multiplier able to calculate a quantity P of form:

$$P = \sum_{i=0}^{N-1} a_i x_i$$

in which the terms $a_i$ are binary words corresponding to N given coefficients and the terms $x_i$ are binary words of B bits corresponding to N variable signals, said generalized digital multiplier being characterized in that it comprises: N shift registers with parallel word input on B bits and series bit output, the ith register containing the B bits of the binary word $x_i$, N conditional adders, each provided with a data input, a data output and a control input, the control input of the ith conditional adder being connected to the output of the ith shift register, the data input and the data output of the ith conditional adder being respectively connected to the data output of the (i−1)ith conditional adder and to the data input of the (i+1)ith conditional adder, said ith conditional adder incorporating the term $a_i$ and adding the latter to the signal received on its data input, conditionally with respect to the value of the jth bit $x_{ij}$ of the word $x_i$, said bit being received on the control input, an adder accumulator provided with first and second data inputs, the first data input being connected to the output of the Nth conditional adder, said adder accumulator also having a data output connected to the second data input of said adder accumulator following the shifting of the bits by one position, a clock circuit for the control in parallel of the shifting of the B bits contained in the N series registers and passing the order j from 0 to B−1 and the sought quantity P being supplied on the data output of the adder accumulator every B clock stroke.

The present invention also relates to a non-recursive digital filter implementing the multiplier defined hereinbefore for the calculation of an expression in form:

$$P = \sum_{i=0}^{N-1} a_i x_{n-1}$$

characterized in that it comprises:

a general input register with N registers of B bits, each register having a parallel input on B bits and a first parallel output on B bits, said registers being interconnected in parallel by said parallel inputs-outputs, each register also having a second parallel output, a digital multiplier according to the aforementioned definition with a group of shift registers and a group of conditional adders, in which the parallel word input of the ith shift register is connected to the second output of the register of the same order i.

BRIEF DESCRIPTION OF THE DRAWINGS

The features and advantages of the invention can be better gathered from the following description of non-limitative embodiments and with reference to the attached drawings.

DETAILED DESCRIPTION OF PREFERRED EMBODIMENTS

Returning to the problem to be solved, which is the calculation of the product:

$$P = \sum_{i=0}^{N-1} a_i x_i \quad (1)$$

it was shown hereinbefore that this product could be placed in the form:

$$P = \sum_{j=0}^{B-1} \left( \sum_{i=0}^{N-1} a_i x_{ij} \right) 2^j \quad (2)$$

The expression in brackets can be written:

$$f_j = \sum_{i=0}^{N-1} a_i u_i \quad (5)$$

in which each of the variables $u_i$ can assume two different values. Thus, the function $f_j$ can assume $2^N$ different values in accordance with the values of the N coefficients $u_i$ forming it, which is the very basis of the aforementioned distributed arithmetic.

Figure 11:
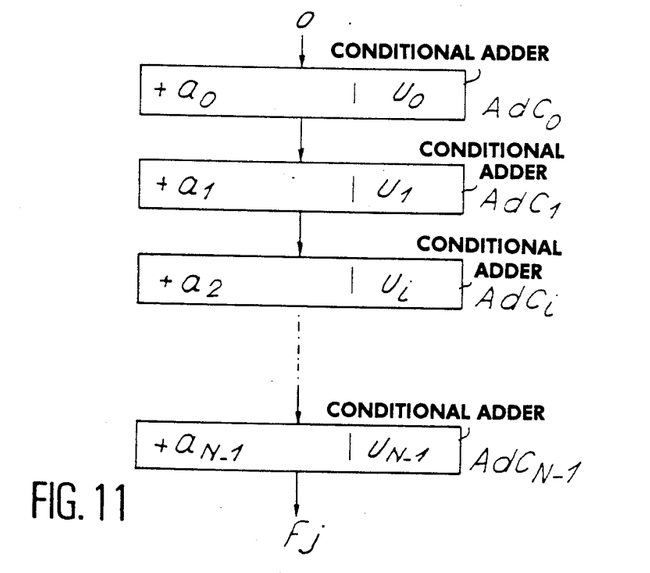
FIG. 11 is a block diagram of a group of conditional adders according to the invention.

According to the invention, function $f_j$ is calculated by a group of conditional adders and not with the aid of a ROM as was the case in the prior art. Such a group is shown in FIG. 11 with the convention already used relative to FIG. 5, namely a conditional adder of order i, designated $AdC_i$, adds $a_i$ to the number which it receives, conditional on the value of the variable $u_i$. The represented group comprises N adders of this type, namely $AdC_0 \ldots AdC_{N-1}$ and finally delivers the function $f_j$ defined by (5).

Such a circuit may appear similar to the prior art parallel multiplier, as illustrated in FIG. 6. However, two essential differences must be stressed. In the adder according to the invention, the constants to be added to each stage differ between the individual stages. It is for this reason that the inventors refer to this multiplier as being "generalized" as opposed to the prior art multipliers, which are to a certain extent specialized, because the constant to be added is always the same. There is no one position shifting between the individual stages (corresponding to multiplication by 2).

However, as a result of the structural similarity between the generalized multiplier according to the invention and the known parallel multiplier, all the variants which have been developed on the latter in order to improve the operating speed are applicable to the generalized multiplier according to the invention.

Figure 12:
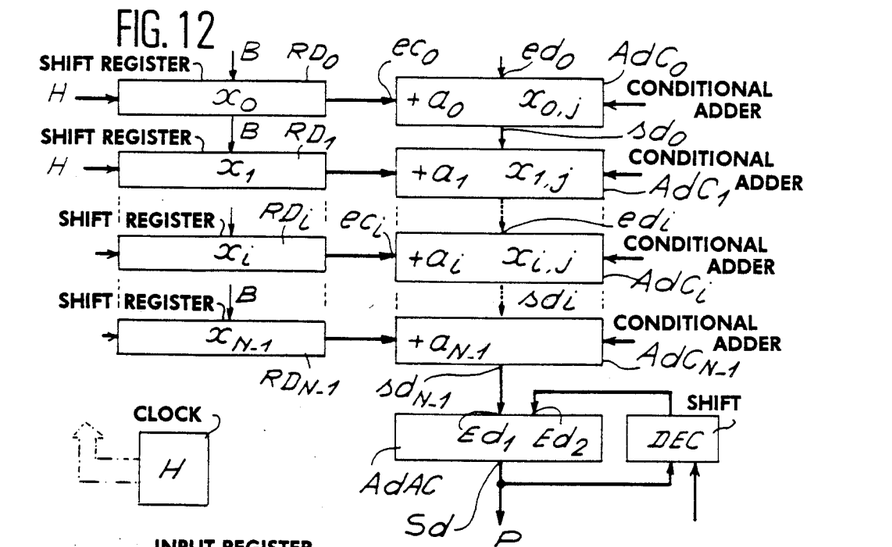
FIG. 12 is the block diagram of the multiplier according to the invention.

The generalized multiplier according to the invention can be in two different forms, as a function of whether use is made of specialized conditional adders in a predetermined addition, as described hereinbefore relative to FIG. 9, or whether use is made of a particular means as a loaded memory point prior to starting up the device for the appropriate value. The first mode is more compact than the second, but it remains specialized in a particular calculation and is shown in FIG. 12.

As shown, the generalized digital multiplier comprises:

N shift registers $RD_0$, $RD_1$ ... $RD_i$, $RD_{N-1}$ with parallel word input on B bits and series bit output, the ith register $RD_i$ containing the B bits of the binary word $x_i$, N conditional adders $AdC_0$, $AdC_1$ ... $AdC_i$ ... $AdC_{N-1}$, the ith adder having a data input $ed_i$, a data output $sd_i$ and a control input $ec_i$, the control input $ec_i$ of the ith conditional adder $AdC_i$ being connected to the output of the ith shift register $RD_i$, the data input $ed_i$ and the data output $sd_i$ of the ith conditional adder being respectively connected to the data output of the $(i-1)$ ith conditional adder and to the data input of the $(i+1)$ ith conditional adder, an adder accumulator AdAc provided with first and second data inputs $Ed_1$, $Ed_2$, the first data input $Ed_1$ being connected to the output $sd_{N-1}$ of the conditional adder of order $N-1$, the adder accumulator AdAc also comprising a data output Sd looped onto the second data input $Ed_2$ of said same adder accumulator, but following a shift by one position (towards the right if the bits contained in the registers $RD_i$ have their lowest order leftmost and to the left in the opposite case), said shift being symbolized in FIG. 12 by a block designated DEC, a clock circuit H for controlling the shifting of the bits contained in the N registers $RD_0$ ... $RD_{N-1}$.

This multiplier functions as follows. The shift registers $RD_0$ ... $RD_i$ ... $RD_{N-1}$ contain the words $x_0$ ... $x_i$ ... $x_{N-1}$. For each clock stroke, the bits of these words are shifted by one position to the right. After j clock strokes on the N outputs of said registers are found the N bits of order j of the words $x_i$, i.e. $x_{0,j}$, $x_{1,j}$, ... $x_{N-1,j}$. The conditional adders $AdC_0$ ... $AdC_i$ ... $AdC_{N-1}$ are able to add a word, respectively $a_0$, $a_1$ ... $a_i$ ... $a_{N-1}$ to the word which they receive on their data input, conditional on the value of the bits $x_{0,j}$, $x_{1,j}$, ... $x_{i,j}$, ... $x_{N-1,j}$ which they receive on their control input.

The final conditional adder $AdC_{N-1}$ supplies the sum $f_j$:

$$f_j = \sum_{i=0}^{N-1} a_i x_{i,j} \quad (5')$$

The adder accumulator AdAc adds to each $f_j$ the $f_{j-1}$ which has been previously obtained but shifted to the right by one position (corresponding to a division by 2). Following N additions of this type, i.e. after B clock strokes, we obtain:

$$\sum_{j=0}^{B-1} f_j 2^j \quad (2')$$

i.e. the sought scalar product P (cf. (1)).

In the circuit of FIG. 12, each conditional adder can be formed in the manner shown in FIG. 10.

This processing of the sign bit in all cases takes place in the same way as for distributed arithmetic: substraction of the partial result $f(x_{0,B-1}, x_{1,B-1}, \ldots x_{N-1,B-1})$ from the content of the accumulator in the case of using the two's complement code.

The multiplier described hereinbefore can be used for forming a non-recursive digital filter. It is known that such a filter is described by the equation:

$$y_n = \sum_{i=0}^{N-1} a_i x_{n-i} \quad (6)$$

in which $a_i$ are coefficients of the filter, $x_{n-i}$ words of order $n-i$, in which n is a fixed index and i a summation index. In other words, digital filtering of a sampled signal is the calculation of a sum of delayed and weighted samples.

It is easy to recognize in (6) a particular case of (1). The non-recursive digital filtering of equation (6) consequently amounts to the calculation of a scalar product, in which $x_i$ are $x_{n-i}$.

A multiplier adapted to digital filtering will have the same structure as in the embodiment of FIG. 12, but the processed digital words would have a slightly different meaning: in the shift register $RD_i$ appears the word $x_{n-i}$, with its B bits $x_{n-i,B-1}, \ldots, x_{n-i,1}, \ldots, x_{n-i,0}$ and in the conditional adders are obtained the coefficients of the filter $a_0, a_1 \ldots a_i \ldots a_{N-1}$. Therefore the multiplier output will give the component of order n of the filtered signal, i.e. $y_n$.

Figure 13:
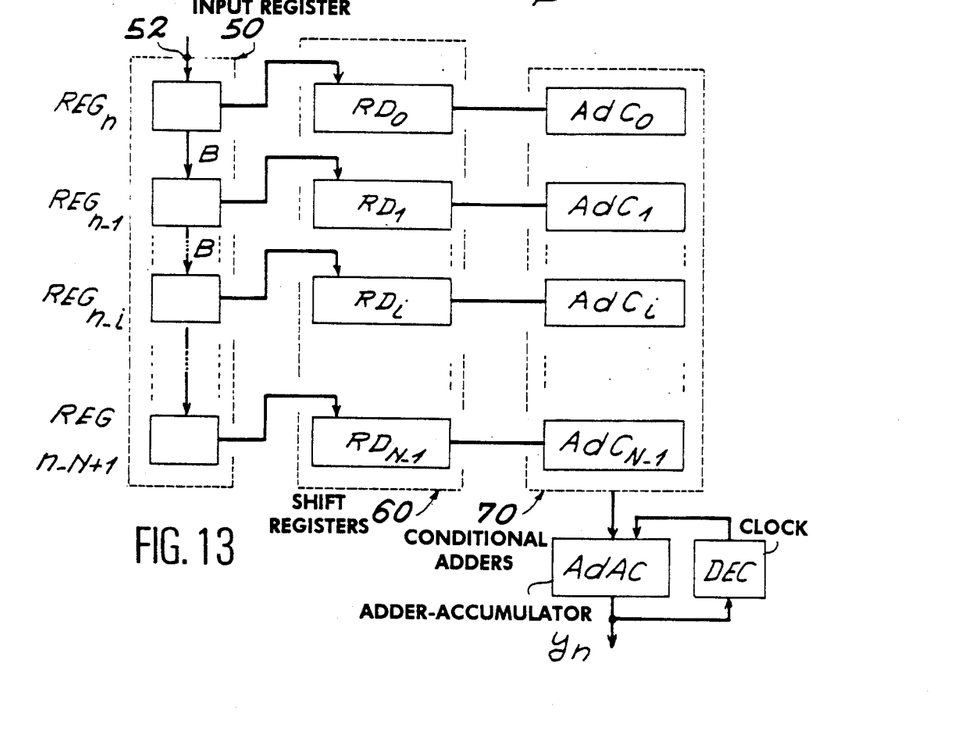
FIG. 13 is a block diagram of a digital filter according to the invention.

In order to obtain the following component $y_{n+1}$, it is necessary to process the samples $x_{n+1}, x_n \ldots x_{n-i+1}$, i.e. shift by one order the set of samples. A complete filter must have a supplementary register able to receive N words representing the N samples necessary for filtering and this is shown in FIG. 13. The filter shown in the latter comprises a general input register 50, a group of shift registers 60, a group of conditional adders 70 and an adder accumulator AdAc.

The input register 50 comprises N registers $REG_n$, $REG_{n-1}, \ldots REG_{n-i}, \ldots REG_{n-N-1}$. All these registers have B bits and are loaded by words of B bits applied in parallel. The group of said N words consequently represents a "photograph" of the sampled signal, which is applied to an input 52.

Each of the registers REG loads one of the shift registers of block 60, the B bits being applied in parallel. Each word is then read by shifting, i.e. bitwise for the processing by block 70. Thus, when the final word $x_n$ has been introduced into 50, i.e. into the first register $REG_n$, the filter can calculate the filtering component $y_n$.

In order to define the operating frequencies of these various parts of such a filter, it is assumed that block 50 operates at a signal frequency $f_s$ (at the word), that the content of said block is recorded at frequency $f_r$ in block 60 (recording frequency) and that the shift registers (at the bit) of block 60 operate at frequency $f_c$, which is the calculating frequency of block 70. The bits constituting the component $y_n$ are consequently obtained at speed $Bf_c$.

A device characterized by:

$$f_r = f_s$$

$$f_s = f_c/B$$

will carry out a FIR-type filtering as described by equation (6). Thus, typically, with existing technology it is possible to obtain $f_c = 25$ MHz. Thus, for B=8 bits, a device can carry out a filtering at a rate of 3 MHz.

It is possible to realize a filter with an output subsampled by a factor M, i.e. in which all the samples are not calculated and instead one sample out of M is calculated, i.e. $y_{n+M}$, $Y_{n+2M}$, etc.

The following parameters can be chosen:

$$f_r = f_s/M$$

$$f_s = Mf_c/B$$

Figure 14:
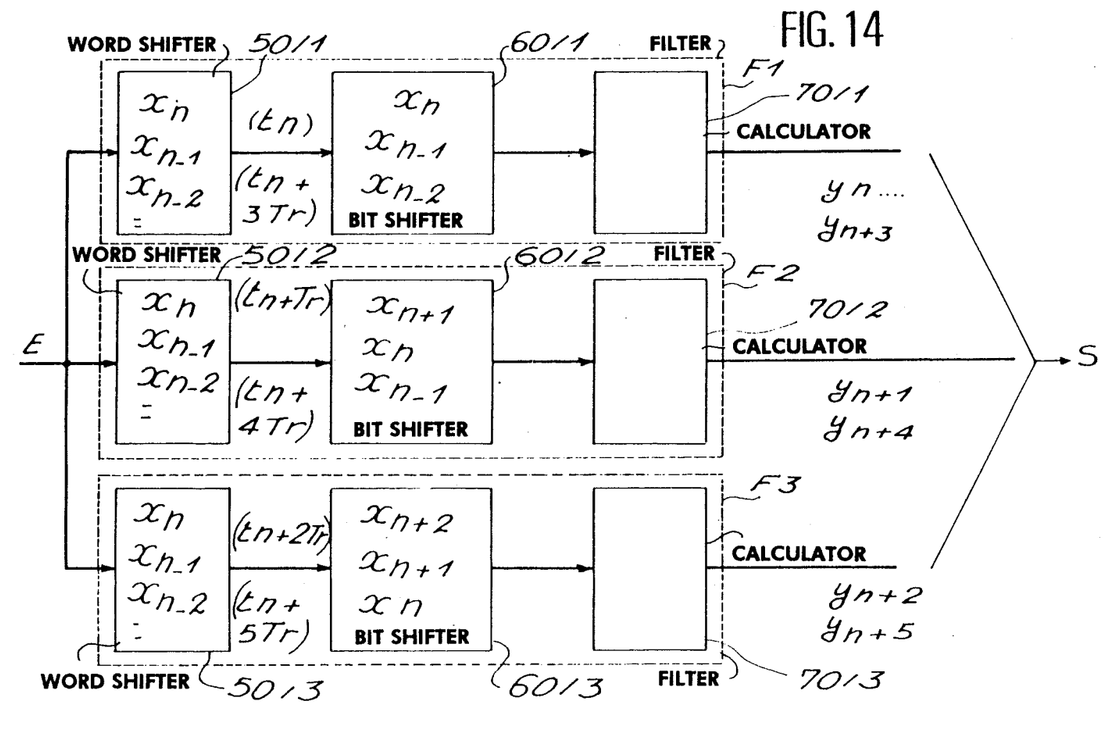
FIG. 14 is a block diagram of a filter with a parallel structure.

The filter according to the invention lends itself to a parallel structure, as illustrated in FIG. 14. The device shown comprises three filters $F_1$, $F_2$ and $F_3$. Each filter has, as illustrated by FIG. 13, a word shifting block 50, a bit shifting block 60 and a calculating block 70. These blocks are allocated numbers 1,2 or 3 for filters $F_1$, $F_2$ and $F_3$.

Filters $F_1$, $F_2$ and $F_3$ have the same input E, in such a way that all the samples $x_n$, $x_{n-1}$, $x_{n-2}$, etc. are applied to the registers 50/1, 50/2 and 50/3, which at a given instant contain the same words. However, the recording instants differ in the blocks 60/1, 60/2 and 60/3. When, at time $t_0$, registers 50/1, 50/2 and 50/3 contain the sequence $x_n$, $x_{n-1}$, $x_{n-2}$, etc. (i.e. at the instant corresponding to the notations of FIG. 14), the recording of register 50/1 takes place in register 60/1.

The recording in register 60/2 will only take place after a time interval T, i.e. at $t_0+T$, if T designates the sampling period corresponding to the frequency of signal $f_s$. In other words, the recording in 60/2 will take place when the sample $x_{n+1}$ has been introduced into the input registers 50/1, 50/2 and 50/3.

In the same way, at instant $t_0+2T$ recording of the sample in block 60/3 takes place, i.e. at an instant when the last sample entered will be $x_{n+2}$.

In such a structure, the calculating block 70/1 will supply a filtering coefficient $y_n$. Following an interval T, block 70/2 will supply the coefficient $y_{n+1}$ and after a new interval T, block 70/3 will supply coefficient $y_{n+2}$. Block 70/1 then supplies a new coefficient $y_{n+3}$, block 70/2 the coefficient $y_{n+4}$, block 70/3 the coefficient $y_{n+5}$, etc. All these coefficients will be combined (as a result e.g. of a three-state output) and will form the continuous sequence of filtering components.

Naturally, although the variant illustrated in FIG. 14 has three filters in parallel, this has only been given in an explanatory manner and the invention covers all filters with parallel structures, no matter what the number of subassemblies. In general terms, it is possible to place in parallel L filters subsampled in a ratio M and operating at recording instants or times shifted by Ts/L, if Ts is the period corresponding to the signal frequency Fs. With L=2, one obtains two filters $F_1$ and $F_2$ and it is possible to choose for each of these filters:

$$f_r = f_s/2$$

$$f_s = 2f_c/B$$

For $f_c = 24$ MHz, B=8 bits, we obtain $f_s = 6$ MHz and $f_s = 3$ MHz.

The phases of the two recording frequencies $f_r$ must be different and shifted by $B/2f_c$.

Thus, in such parallel structure devices, only part 50 operates at the signal frequency $f_s$. Therefore it is this part which will limit the possible rate by placing devices in parallel. All the other frequencies are of the order $f_c$.

It is possible to choose the frequencies $f_c$, $f_r$, $f_s$, in such a way that the sums $y_n$ are subsampled by a factor M times less than the sampling factor of a device.

It is therefore possible to obtain identical circuits, so that one of them produces the frequency $f_r$ and in turn supplies a sync signal enabling it to produce its own frequency $f_r$, which is phase displaced and whereby the second device in turn supplies another sync signal and so on.

It is possible to recapitulate the different parameters involved in a parallel structure filter in the manner described hereinbefore:

L: number of circuits to be connected in parallel,
M: subsampling level,
$f_c$: calculating frequency,
$f_s$: signal frequency,
$f_r$: recording frequency
$E_{sync}$: sync input
$S_{sync}$: sync output,
B: number of bits of the input signal,
DS: $S_{sync} - E_{sync}$ = time lag between signals $f_r$ of two successive circuits.

All these parameters are in fact dependent on four fundamental data $f_c$, $f_s$, M, B, so that we obtain:

$$L = f_s/f_c \cdot B/M,$$

$$f_r = f_c/B,$$

$$DS = B/F_c \cdot L = M/f_s.$$

The first unconnectd sync input will indicate a non-shifted recording frequency, DS indicating the shift with the following circuit.

The subassembly [L, M, max($f_c$, $f_s$)], (B naturally being known at the time of designing the circuit) supplies all the parameters permitting an easy generation of the other signals and also a simple use of the circuit. For example, it is possible to choose the following circuit:

$f_s$ 50 MHz, $f_c = 25$ MHz, B=8, M=1, N=40.

We obtain: L=16 circuits in parallel, $$f_r = 3 \text{ MHz},$$

$$DS = 1/50 \text{ MHz}.$$

From the standpoint of the material realization of the circuit, each circuit has approximately 30,000 transistors in CMOS technology and 3 "pipeline" levels. Such a circuit can be used as a filter in a modem intended for artificial satellites.

A group of 16 identical circuits connected in a simple manner (identical inputs, identical outputs, quasi-identical controls) thus permits digital filtering at a 50 MHz sampling frequency.

It is obvious that the structure described hereinbefore have been diagrammatically represented so as to show their essential functions. In practice, i.e. in an integrated circuit performing these functions, it is possible to distribute these means in a different way, e.g. by interleaving or mixing them. Thus, the registers of part 50 could be brought closer to the registers of part 60 to facilitate the recording of the samples.

It is also possible to produce integrated circuits in such a way that the specification of the coefficients of the filter is only involved during the final masking operation. Thus, on request, it is possible to very rapidly produce a given filter on the basis of the previously obtained gate arrays.

We claim:

1. Generalized digital multiplier able to calculate a quantity P of form:

$$P = \sum_{i=0}^{N-1} a_i x_i$$

in which the terms $a_i$ are binary words corresponding to N given coefficients and the terms $x_i$ are binary words of B bits corresponding to N variable signals, said generalized digital multiplier being characterized in that it comprises:

N shift registers ($RD_0, \ldots RD_{N-1}$) with parallel word input on B bits and series bit output, the ith register ($RD_i$) containing the B bits of the binary word $x_i$, N conditional adders ($AdC_0, \ldots, AdC_{N-1}$) each provided with a data input, a data output and a control input, the control input ($ec_i$) of the ith conditional adder ($AdC_i$) being connected to the output of the ith shift register, ($RD_i$), the data input ($ed_i$) and the data output ($sd_i$) of the ith conditional adder ($AdC_i$) being respectively connected to the data ouput of the (i−1)th conditional adder and to the data input of the (i+1)th conditional adder, said ith conditional adder ($AdC_i$) incorporating the term $a_i$ and adding the latter to the signal received on its data input, conditionally with respect to the value of the jth bit $x_{ij}$ of the word $x_i$, said bit being received on the control input ($ec_i$), an adder accumulator (AdAc) provided with first and second data inputs, ($Ed_1$, $Ed_2$) the first data input ($Ed_1$) being connected to the output ($sd_{N-1}$) of the Nth conditional adder, ($AdC_{N-1}$), said adder accumulator (AdAc) also having a data output (Sd) connected to the second data input ($Ed_2$) of said adder accumulator (AdAc) following the shifting of the bits by one position, a clock circuit (H) for the control in parallel of the shifting of the B bits contained in the N series registers ($RD_0, \ldots, RD_{N-1}$) and passing the order j from 0 to B-1 and the sought quantity P being supplied on the data output of the adder accumulator (AdAc) every B clock stroke.

2. Digital multiplier according to claim 1, characterized in that each conditional adder ($AdC_i$) is constituted by an adder ($Ad_i$), and a multiplexer ($MX_i$) with two data inputs ($e_i$, $e'_i$) respectively connected to the input and output of the adder ($Ad_i$) and a control input ($Ec_i$) connected to the output of the shift register of the same order ($RD_i$) and receiving a bit ($x_{ij}$).

3. Non-recursive digital filter for the calculation of an expression in form:

$$P = \sum_{i=0}^{N-1} a_i x_{n-1}$$

in which the terms $a_i$ are binary words corresponding to N given coefficients and the terms $x_i$ are binary words of B bits corresponding to N variable signals, said filter comprising:

a general input register with N shift registers ($REG_n, \ldots, REG_{n-N+1}$) of B bits, each register having a parallel input on B bits and a first parallel output on B bits, said registers being interconnected in parallel by said parallel inputs-outputs, each register also having a second parallel output, said shift registers ($REG_n, \ldots, REG_{n-N+1}$) operating at a frequency $f_s'$ and a digital multiplier comprising:
N shift registers ($RD_0, \ldots, RD_{N-1}$) with parallel word input on B bits and series bit output, the ith register ($RD_i$) containing the B bits of the binary word $x_i$, said parallel word input of a ith register ($RD_i$) being connected to said second output of the ith register ($REG_i$) of said general input register, said shift register ($RD_0, \ldots, RD_{N-1}$) operating at a frequency $f_r$, N conditional adders ($AdC_0, \ldots, AdC_{N-1}$) each provided with a data input, a data output ($ec_i$) of the ith conditional adder ($AdC_i$) being connected to the output of the ith register, ($RD_i$), the data input ($ed_i$) and the data output ($sd_i$) of the ith conditional adder ($AdC_i$) being respectively connected to the data output of the (i−1)th conditional adder and to the data input of the (i+1)th conditional adder, said ith conditional adder ($AdC_i$) incorporating the term $a_i$ and adding the latter to the signal received on its data input, conditionally with respect to the value of the jth bit $x_{ij}$ of the word $x_j$, said bit being received on the control input ($ec_i$), said conditional adders ($AdC_0, \ldots, Adc_{N-1}$) operating at a calculating frequency $f_c$, an adder accumulator (AdAc) provided with first and second data inputs, ($Ed_1$, $Ed_2$) the first data input ($Ed_1$) being connected to the output ($sd_{N-1}$), sid adder accumulator (AdAc) also having a data output (Sd) connected to the second data input ($Ed_2$) of said adder accumulator (AdAc) following the shifting of the bits by one position, a clock circuit (H) for the control in parallel of the shifting of the B bits contained in the N series registers ($RD_0, \ldots, RD_{N-1}$) and passing the order j from 0 to B-1 and the sought quantity P being supplied on the data output of the adder accumulator (AdAc) every B clock stroke.

4. Digital filter according to claim 3, wherein said $f_r = f_s$ and $f_c = Bf_s$.

5. Digital filter according to claim 3, further including a means for operating with subsampling of a factor M and $f_r = f_s/M$ and $f_c = BF_s/M$.

6. A digital filter comprising L filters ($F_1, F_2$, etc . . . ) in parallel, said L filters having a common input (E) receiving samples ($x_n, x_{n-1}$, etc.) at a signal frequency $f_s$, each filter only recording the samples at a frequency $f_r = f_s/L$ at different times between individual filters and shifted by (Ts/L), in which Ts designates the period corresponding to frequency $F_s$, said filters having outputs being connected at a single output constituting an output of said digital filter, each filter calculating an expression in form:

$$P = \sum_{i=0}^{N-1} a_i x_{n-1}$$

in which the terms $a_i$ are binary words corresponding to N given coefficients and the terms $x_i$ are binary words of B bits corresponding to N variable signals, each filter comprising:

- a general input register with N shift registers (REG$_n$, ..., REG$_{n-N+1}$) of B bits, each register having a parallel input on B bits and a first parallel output on B bits, said registers being interconnected in parallel by said parallel inputs-outputs, each register also having a second parallel output, said shift registers (REG$_n$, ..., REG$_{n-N+1}$) operating at a frequency $f_s$,
- a digital multiplier comprising:
 N shift registers (RD$_0$, ..., RD$_{N-1}$) with parallel word input on B bits and series bit output, the ith register (RD$_i$) containing the B bits of the binary word $x_i$, said parallel word input of a ith register (RD$_i$) being connected to said second output of the ith register (REG$_i$) of said general input register, said shift register (RD$_0$, ..., RD$_{N-1}$ operating at a frequency $f_r$,
 N conditional adders (AdC$_0$, ..., AdC$_{N-1}$) each provided with a data input, a data output and a control input, the control input (ec$_i$) of the ith conditional adder (AdC$_i$) being connected to the output of the ith register, (RD$_i$), the data input (ed$_i$) and the data output (sd$_i$) of the ith conditional adder (AdC$_i$) being respectively connected to the data output of the (i−1)th conditional adder and to the data input of the (i+1)th conditional adder, said ith conditional adder (AdC$_i$) incorporating the term $a_i$ and adding the latter to the signal received on its data input, conditionally with respect to the value of the jth bit $x_{ij}$ of the word $x_j$, said bit being received on the control input (ed$_i$), said conditional adders (AdC$_0$, ..., AdC$_{N-1}$) operating at a calculating frequency $f_c$,
 an adder accumulator (AdAc) provided with first and second data inputs, (Ed$_1$, Ed$_2$) the first data input (Ed$_1$) being connected to the output (sd$_{N-1}$), said adder accumulator (AdAc) also having a data output (Sd) connected to the second data input (ED$_2$) of said adder accumulator (AdAc) following the shifting of the bits by one position,
 a clock circuit (H) for the control in parallel of the shifting of the B bits contained in the N series registers (RD$_0'$, ..., RD$_{N-1}$) and passing the order j from 0 to B-1 and the sought quantity P being supplied on the data output of the adder accumulator (AdAc) every B clock stroke.

* * * * *